(12) United States Patent
Wang et al.

(10) Patent No.: US 11,290,132 B1
(45) Date of Patent: Mar. 29, 2022

(54) DATA DECODING CIRCUIT AND METHOD

(71) Applicant: REALTEK SEMICONDUCTOR CORPORATION, Hsinchu (TW)

(72) Inventors: Feng-Xiang Wang, Suzhou (CN); Jyun-Wei Pu, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/345,378

(22) Filed: Jun. 11, 2021

(30) Foreign Application Priority Data

Oct. 12, 2020 (CN) .......................... 202011082681.2

(51) Int. Cl.
*H03M 13/41* (2006.01)
*H04L 1/00* (2006.01)

(52) U.S. Cl.
CPC ........ *H03M 13/413* (2013.01); *H04L 1/0054* (2013.01); *H04L 1/0067* (2013.01)

(58) Field of Classification Search
CPC ........................... H03M 13/413; H04L 1/0054
See application file for complete search history.

(56) References Cited

U.S. PATENT DOCUMENTS

| | | | | |
|---|---|---|---|---|
| 5,673,291 A * | 9/1997 | Dent | ................. | H03M 13/2721 329/304 |
| 6,973,610 B1 * | 12/2005 | Xu | ....................... | H04L 1/0054 714/752 |
| 10,720,944 B2 | 7/2020 | Chan et al. | | |
| 10,797,726 B2 | 10/2020 | Hsu | | |
| 2001/0003208 A1 | 6/2001 | Wan | | |
| 2002/0016945 A1 | 2/2002 | Sayood et al. | | |
| 2002/0178418 A1 * | 11/2002 | Ramprashad | ......... | H03M 13/09 714/755 |
| 2007/0195675 A1 | 8/2007 | Lee et al. | | |
| 2009/0304114 A1 | 12/2009 | Burg | | |
| 2010/0046547 A1 * | 2/2010 | Gurevitz | ................. | H04L 69/22 370/474 |

FOREIGN PATENT DOCUMENTS

TW    I672930    9/2019
TW    202008734  2/2020

* cited by examiner

*Primary Examiner* — Joseph D Torres
(74) *Attorney, Agent, or Firm* — WPAT, PC

(57) ABSTRACT

The present invention discloses a data decoding circuit. A data reforming circuit receives encoded data encoded by using tail-biting convolutional code to identify a first unknown bit section, a known bit section and a second unknown bit section in an order to further connect the second unknown bit section and the first unknown bit section in series to generate data to be decoded. A decoding circuit decodes the data to be decoded by using Viterbi algorithm and at least one piece of known bit information to generate a decoded result that includes a second decoded bit section and a first decoded bit section respectively corresponding to the second unknown bit section and the first unknown bit section. A data restoring circuit connects the first decoded bit section, a known decoded bit section corresponding to the known bit section and the second decoded bit section in series to generate decoded data.

10 Claims, 5 Drawing Sheets

DATA DECODING CIRCUIT AND METHOD

BACKGROUND OF THE INVENTION

1. Field of the Invention

The present invention relates to a decoding circuit and a decoding method.

2. Description of Related Art

In a low power wide area network, the users have more demands for low power dissipation especially in the applications of Internet of Thing (IoT), in which lots of apparatuses are connected to the network. Some apparatuses are configured to have low data amount transmission and longer time of idling. When the packet error rate of the received data is too high, these apparatuses have to wait for the signal transmission terminal to resend the signal to increase the accuracy of demodulation.

As a result, the method to improve the performance of the packet error rate of the signal receiving terminal to decrease the number of resending the signal to further decrease the power dissipation and extend the battery life is an important issue.

SUMMARY OF THE INVENTION

In consideration of the problem of the prior art, an object of the present invention is to supply a computer system and an electronic apparatus having secure boot mechanism and an operation status restoring method thereof.

The present invention discloses a decoding circuit that includes a data reforming circuit, a decoding circuit and a data restoring circuit. The data reforming circuit is configured to receive encoded data encoded by using tail-biting convolutional code technology to sequentially identify a first unknown bit section, a known bit section and a second unknown bit section, to further concatenate the second unknown bit section and the first unknown bit section in series to generate data to be decoded. The decoding circuit is configured to decode the data to be decoded by using Viterbi algorithm and at least one piece of known bit information, to generate a decoded result that comprises a second decoded bit section and a first decoded bit section respectively corresponding to the second unknown bit section and the first unknown bit section. The data restoring circuit is configured to concatenate the first decoded bit section, a known decoded bit section corresponding to the known bit section and the second decoded bit section in series to generate decoded data.

The present invention also discloses a decoding method used in a data decoding circuit that includes the steps outlined below. Encoded data encoded by using tail-biting convolutional code technology is received to sequentially identify a first unknown bit section, a known bit section and a second unknown bit section, to further concatenate the second unknown bit section and the first unknown bit section in series to generate data to be decoded by a data reforming circuit. The data to be decoded is decoded by using Viterbi algorithm and at least one piece of known bit information, to generate a decoded result that includes a second decoded bit section and a first decoded bit section respectively corresponding to the second unknown bit section and the first unknown bit section by a decoding circuit. The first decoded bit section, a known decoded bit section corresponding to the known bit section and the second decoded bit section are concatenated in series to generated decoded data by a data restoring circuit.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

An aspect of the present invention is to provide a decoding circuit and a decoding method to use the characteristic of the tail-biting convolutional code to decrease the search order while the performance of decoding is maintained. The present invention can be adapted to a common communication system using tail-biting convolutional code encoder and/or decoder, e.g. Long Term Evolution (LTE) communication system and Internet of Things (IoT).

Figure 1:
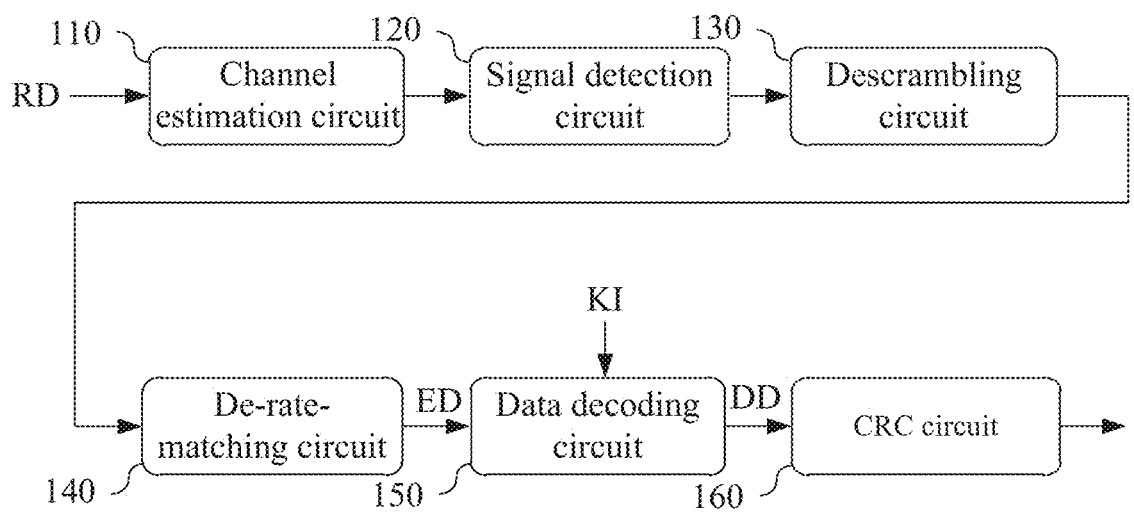
FIG. 1 illustrates a block diagram of a data receiving circuit according to an embodiment of the present invention.

Reference is now made to FIG. 1. FIG. 1 illustrates a block diagram of a data receiving circuit 100 according to an embodiment of the present invention. The data receiving circuit 100 includes a channel estimation circuit 110, a signal detection circuit 120, a descrambling circuit 130, a de-rate-matching circuit 140, a data decoding circuit 150 and a cyclic redundancy check (CRC) circuit 160.

In an embodiment, the channel estimation circuit 110 receives received data RD from a data transmission apparatus (not illustrated in the figure) through a transmission channel. The channel estimation circuit 110, the signal detection circuit 120, the descrambling circuit 130 and the de-rate-matching circuit 140 perform corresponding pre-processing on the received data RD in series to generate encoded data ED. Those of ordinary skill in the art can perform the pre-processing by using various methods. The detail is not described herein.

The data decoding circuit 150 performs decoding on the encoded data ED to generate decoded data DD such that the cyclic redundancy check circuit 160 performs checking on a part of the decoded data DD corresponding to the cyclic redundancy check (CRC) code. After the checking is performed, the data receiving is finished.

In an embodiment, the decoding method is related to the characteristic of the encoding of the encoded data ED performed on the data transmission apparatus. In an embodiment, the encoded data ED is generated by performing encoding on original data with tail-biting convolutional code technology by an encoding circuit in the data transmission apparatus.

The characteristic of the tail-biting convolutional code encoding technology is described in detail in the following paragraphs.

Figure 2:
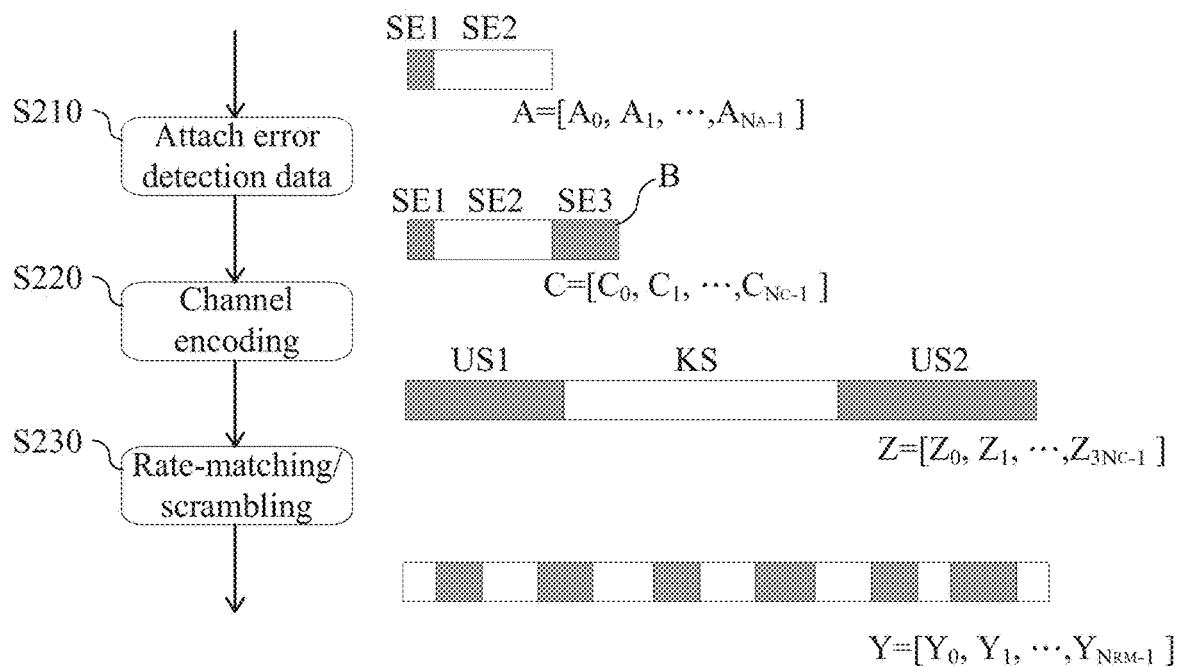
FIG. 2 illustrates a diagram of an encoding process that encodes original data to generate encoded data according to an embodiment of the present invention.
Figure 3:
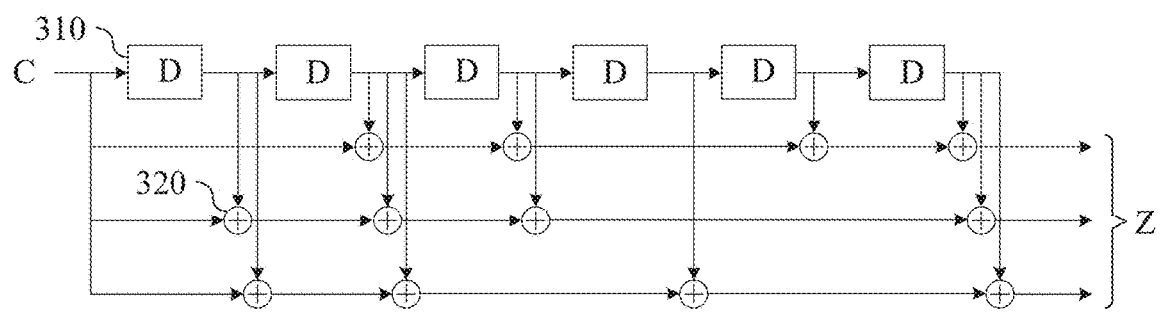
FIG. 3 illustrates a diagram of an encoding circuit according to an embodiment of the present invention.

Reference is now made to FIG. 2 and FIG. 3 at the same time. FIG. 2 illustrates a diagram of an encoding flow that encodes original data A to generate encoded data Z according to an embodiment of the present invention. FIG. 3 illustrates a diagram of an encoding circuit 300 according to an embodiment of the present invention.

As illustrated in FIG. 2, the original data original data A is a vector having a length of $N_A \times 1$, which includes $N_A$ bits of data and includes a first under-encoded bit section SE1 and a second under-encoded bit section SE2. For the decoding terminal that is able to perform prediction, the first under-encoded bit section SE1 is an unknown bit section and the second under-encoded bit section SE2 is a known bit section. The first under-encoded bit section SE1 may include such as, but not limit to a system frame number (SFN) and a hyper system frame number (hyper SFN).

In step S210, a third under-encoded bit section SE3, e.g., error detection data B having a length of $N_B$, is attached to the original data A to become data C having a length of $N_C$. The error detection data B can be implemented by such as, but not limited to cyclic redundancy check code to check the accuracy of the original data A. The error detection data B is generated according to the calculation performed based on the first under-encoded bit section SE1 and the second under-encoded bit section SE2, and is also an unknown bit section. Under such a condition, $N_C = N_A + N_B$.

In step S220, a channel encoding is performed on the data C by the encoding circuit 300 to resist the channel effect.

As illustrated in FIG. 3, in an embodiment, the encoding circuit 300 includes a plurality of registers 310 (labeled as 'D') having a number of L (e.g. 6) and a plurality of adders 320 (labeled as '+'). By using the components described above, the encoding circuit 300 in FIG. 3 can implement the tail-biting convolutional code encoding technology with such as 1/3 of encoding rate, to generate data Z having a length of $3N_C \times 1$. However, the present invention is not limited to a particular encoding rate.

The error detection data B generated based on the cyclic redundancy check code is related to every bit of the original data A. When a section of unknown bits (first under-encoded bit section SE1) is included in the original data A, the bits of the error detection data B are all unknown. As a result, in the data C, the first under-encoded bit section SE1 and the third under-encoded bit section SE3 are unknown bit sections, and the second under-encoded bit section SE2 is a known bit section.

The number of the unknown bits in the data Z increases due to the characteristic of the convolutional code, and the number of the unknown bits is related to the encoding rate and the constraint length of the convolutional code. The constraint length is the number L of the registers 210 included in the encoding circuit 300. In an embodiment, the data Z includes a first unknown bit section US1, a known bit section KS and a second unknown bit section US2.

In an example of practical numbers, the lengths of the first under-encoded bit section SE1, the second under-encoded bit section SE2 and the third under-encoded bit section SE3 are 6, 28 and 16 bits.

By using an encoding rate of 1/3, the first unknown bit section US1 is generated according to the first under-encoded bit section SE1 (6 bits) and a first part (6 bits) of the second under-encoded bit section SE2 that is neighboring to the first under-encoded bit section SE1 and having the length equal to the register length. As a result, the first unknown bit section US1 has the length of (6+6)×3=36 bits. The known bit section KS is generated according to a second part (22 bits) of the second under-encoded bit section SE2 other than the first part. As a result, the known bit section KS has the length of (28−6)×3=66 bits. The second unknown bit section US2 is generated according to the third under-encoded bit section SE2. As a result, the second unknown bit section US2 has the length of 16×3=48 bits.

In step S230, the data Z is evenly distributed in all usable units through the use of rate-matching and/or scrambling to form data under transmitted Y that is modulated and encoded to have the length of $N_{RM} \times 1$. Such as step does not affect the ratio of the numbers of unknown bits and known bits and only affects the position of the unknown bits in the data under transmitted Y.

The data under transmitted Y is further transmitted through the transmission channel and received by the channel estimation circuit 110 as the received data RD. The content of the encoded data ED generated after the pre-processing equals to the data Z.

The data decoding circuit 150 decodes the encoded data ED according to the known bit information KI in response to the characteristic of the tail-biting convolutional code described above. The configuration and operation of the data decoding circuit 150 are described in the following paragraphs.

Figure 4:
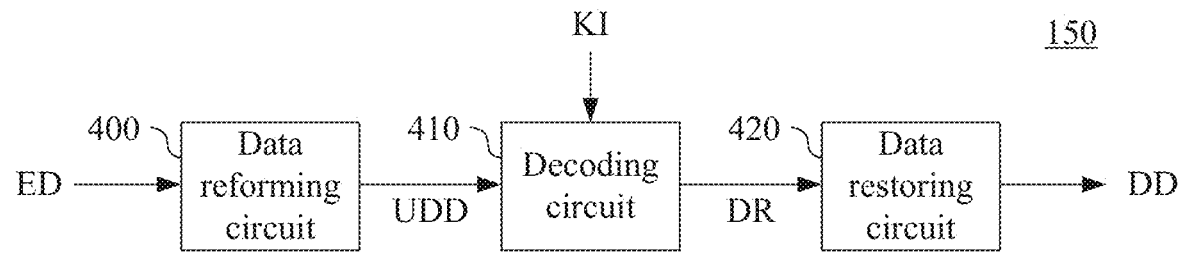
FIG. 4 illustrates a block diagram of the data decoding circuit in FIG. 1 according to an embodiment of the present invention.
Figure 5:
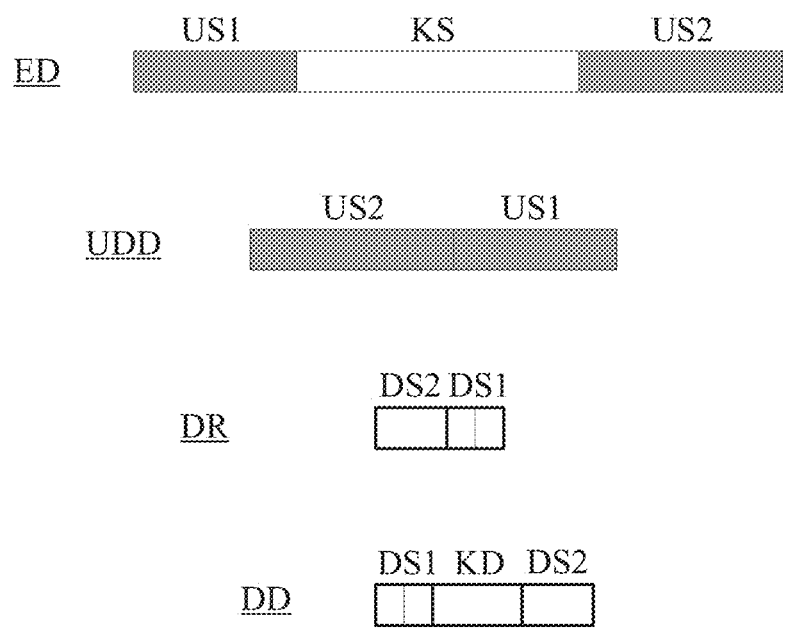
FIG. 5 illustrates a diagram of a process that generates the decoded data from the encoded data through the processing of the data decoding circuit according to an embodiment of the present invention.

Reference is now made to FIG. 4 and FIG. 5 at the same time. FIG. 4 illustrates a block diagram of the data decoding circuit 150 in FIG. 1 according to an embodiment of the present invention. FIG. 5 illustrates a diagram of a process that generates the decoded data DD from the encoded data ED through the processing of the data decoding circuit 150 according to an embodiment of the present invention.

In an embodiment, the data decoding circuit 150 includes a data reforming circuit 400, a decoding circuit 410 and a data restoring circuit 420.

The data reforming circuit 400 receives the encoded data ED to sequentially identify the sections in the encoded data ED having different characteristics to perform reforming to generate the data to be decoded UDD.

As described above, the content of the encoded data ED is actually the same as the encoded data Z in FIG. 2. The data reforming circuit 300 sequentially identifies the first unknown bit section US1, the known bit section KS and the second unknown bit section US2 included in the encoded data ED, to further concatenate the second unknown bit section US2 and the first unknown bit section US1 in series to generate the data to be decoded UDD.

For the tail-biting convolutional code, the initial state and the terminal state of the register are the same. As a result, the decoding can be performed by concatenating the data in the front side to the data in the rear side. According to the example of practical numbers described previously, since the first unknown bit section US1 has the length of 36 bits and the second unknown bit section US2 has the length of 48 bits, the data to be decoded UDD has the length of 48+36=84 bits.

The decoding circuit 410 decodes the data to be decoded UDD by using Viterbi algorithm and the known bit information KI, to generate a decoded result DR.

In an embodiment, the known bit information KI includes the values used to predict some of the bits of the current signal, in which the values are generated by part of the circuits (not illustrated in the figure) of the data receiving circuit 100 through the performance of statistics and analysis on previously transmitted data. The generation of the known bit information KI can be implemented by using the method described in such as, but not limited to Taiwan Patent Publication Number 1672930. However, the present invention is not limited thereto. In an embodiment, the content of the known bit information KI corresponds to the second under-encoded bit section SE2 in the data C.

Before the decoding circuit 410 performs a search process for searching all the possible states on the data to be decoded UDD, an initial search state is required to be set. Since the register length that the data encoding apparatus 300 uses to perform encoding is L, and the data to be decoded UDD disposes the second unknown bit section US2 corresponding to the cyclic redundancy check code at the front side, the decoding circuit 410 determines the initial search state according to a part of the second under-encoded bit section SE2 neighboring to the third under-encoded bit section SE3 and having the length equal to the register length L (e.g., 6 bits) in the data C.

After setting the initial search state, the decoding circuit 410 set each of the bits of the data to be decoded UDD in series as a current bit to perform the search process.

At first, the decoding circuit 410 determines whether the current bit is known according to the known bit information KI. When the current bit is known and is 0, the decoding circuit 410 sets a second half of a plurality of states corresponding to the current bit as invalid, and sets a corresponding accumulated metric value as a minimum value. When the current bit is known and is 1, the decoding circuit 410 sets a first half of the states corresponding to the current bit as invalid and sets the corresponding accumulated metric value as the minimum value.

When the register length L is 6, the current bit has $2^6=64$ possible states. When the current bit is 0, the decoding circuit 410 sets the second half of the states (32~63) corresponding to the current bit as invalid. When the current bit is 1, the decoding circuit 410 sets the first half of the states (0~31) corresponding to the current bit as invalid. In both situations, the decoding circuit 410 sets the corresponding accumulated metric value as the minimum value.

Subsequently, the decoding circuit 410 determines whether at least one of two previous states, corresponding to any one of a currently possible state of the states of the current bit that are not set as invalid, is valid when the current bit is known or unknown.

The decoding circuit 410 sets the currently possible state as invalid and sets the corresponding accumulated metric value as the minimum value when the two previous states are all invalid.

The decoding circuit 410 sets the currently possible state as valid to respectively calculate the accumulated metric value of the currently possible state corresponding to each of the two previous states when at least one of the two previous states is valid.

More specifically, when only one of the two previous states is valid, the accumulated metric value Mac of the current possible state becomes the sum of the accumulated metric value Mpre of such a valid previous state and the current metric value Mcur of the currently possible state (Mac=Mpre+Mcur). The calculating method of the current metric value Mcur is well-known by those of ordinary skill in the art and is not described in detail herein.

When both of the two previous states are valid, the currently possible state generates two accumulated metric values Mac0 and Mac1 corresponding to the two previous states. The accumulated metric value Mac0 is the sum of the accumulated metric value Mpre0 corresponding to one of the previous states and the current metric value Mcur of the currently possible state (Mac0=Mpre0+Mcur0). The accumulated metric value Mac1 is the sum of the accumulated metric value Mpre1 corresponding to another one of the previous states and the current metric value Mcur of the currently possible state (Mac1=Mpre1+Mcur1).

The decoding circuit 410 selects a larger one of the accumulated metric value corresponding to one of the previous states as the accumulated metric value of the currently possible state, and selects one of the previous states corresponding to the larger one of the accumulated metric value as a survived path. When only one of the previous states is valid, since only one of the corresponding accumulated metric value exists, such accumulated metric value is directly selected as the accumulated metric value of the currently possible state, and the corresponding valid previous state is selected as the survived path.

The decoding circuit 410 sets a next bit that is a next one of the current bit as the current bit to perform the search process when all the states are determined and the corresponding accumulated metric value is generated. The decoding circuit 410 further performs backtracking according to the survived path to generate the decoded result DR after the search process of all the bits of the data to be decoded UDD is finished. In an embodiment, the decoded result DR includes a second decoded bit section DS2 and a first decoded bit section DS1 respectively corresponding to the second unknown bit section US2 and the first unknown bit section US1.

The data restoring circuit 420 concatenates the first decoded bit section DS1, the known decoded bit section KD corresponding to the known bit section KS and the second decoded bit section DS2 to generate the decoded data DD. Since the original content of the known bit section KS can be obtained from the known bit information KI, the known decoded bit section KD can be generated without the decoding process.

Referring to the content illustrated in FIG. 2 and the example of the values described above, the first decoded bit section DS1 includes data content corresponding to the first under-encoded bit section SE1 (6 bits), and the first part (6 bits) of the second under-encoded bit section SE2 neighboring to the first under-encoded bit section SE1 and having the length equal to the register length L. The known decoded bit section KD includes the second part (22 bits) of the second under-encoded bit section SE2 other than the first part. The second decoded bit section DS2 includes the data content of the third under-encoded bit section SE3 (16 bits).

Figure 6:
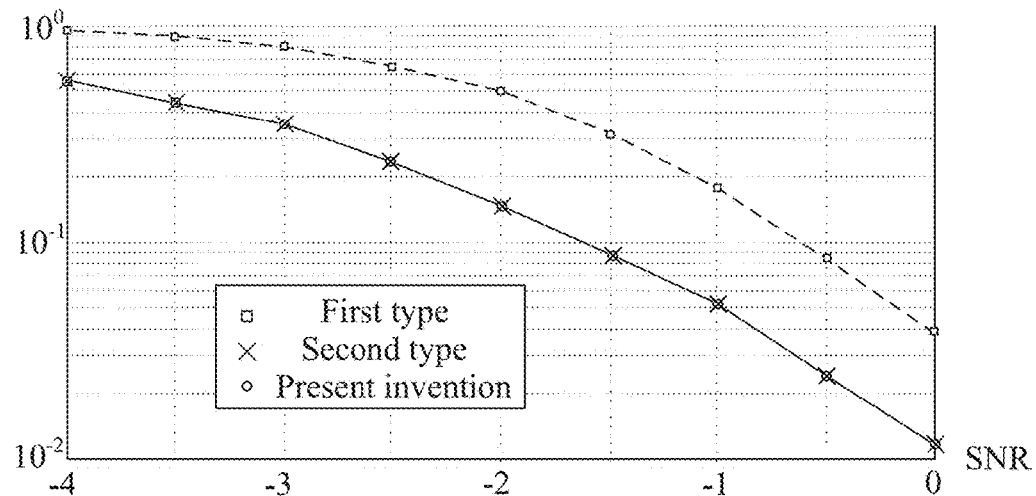
FIG. 6 is a diagram of the efficiency of different decoding methods used by the data decoding circuit according to an embodiment of the present invention.

Reference is now made to FIG. 6. FIG. 6 is a diagram of the efficiency of different decoding methods used by the data decoding circuit according to an embodiment of the present invention. The X-axis stands for signal-to-noise ratio (SNR) having the unit of dB, and the Y-axis stands for packet error rate.

As illustrated in FIG. 6, the line connected with square dots corresponds to a first type decoding method that duplicate the encoded data twice and concatenate the original encoded data and the duplicated data to perform Viterbi decoding process to search all the possible paths. The line connected with X symbols corresponds to a second type decoding method that duplicate the encoded data once and concatenate the original encoded data and the duplicated data to perform Viterbi decoding process to search the remain possible paths after part of the paths are excluded according to the known bit information. The line connected with round dots corresponds to the method of the present invention, in which the encoded data is not required to be duplicated. The encoded data is reformed and part of the paths are excluded according to the known bit information to search the remaining possible paths.

Referring to the content illustrated in FIG. 2 and the example of the values described above, for the data C that has the content of 50 bits separating into three sections (6+28+16), the first type decoding method needs to perform the search process with an order of 150 due to the twice duplication of the encoded data, and the second type decoding method needs to perform the search process with an order of 100 due to the once duplication of the encoded data. The method used in present invention only needs to perform the search process with the order of 28 (6+6+16). On the aspect packet error rate, the packet error rate generated by using the prevent invention is apparently lower that the packet error rate generated by using the first type decoding method. Further, the search order in the prevent invention is greatly reduced, comparing with the second type decoding method, while the performance is the same.

As a result, the data decoding circuit of the present invention uses the characteristic of the tail-biting convolutional code to lower the search order and maintain the decoding efficiency at the same time. The power dissipation of the data decoding circuit is greatly reduced such that the data receiving apparatus can save more power.

Figure 7:
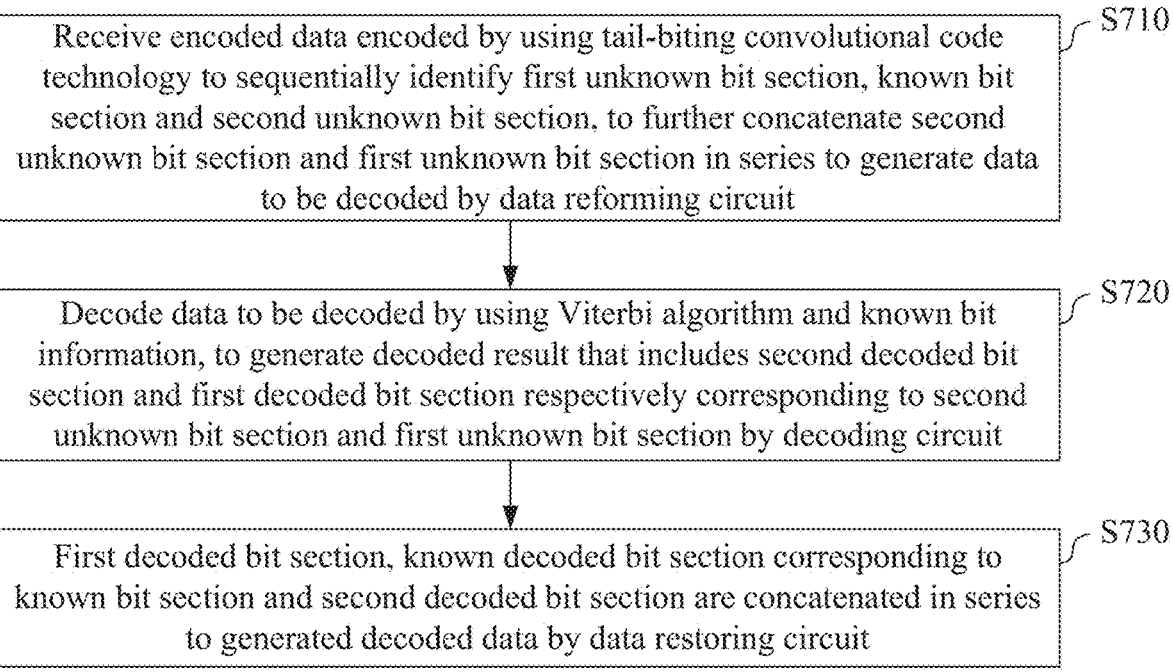
FIG. 7 illustrates a flow chart of a data decoding method according to an embodiment of the present invention.

Reference is now made to FIG. 7. FIG. 7 illustrates a flow chart of a data decoding method 700 according to an embodiment of the present invention.

Besides the apparatus described above, the present invention further discloses the data decoding method 700 that can be used in such as, but not limited to the data decoding circuit 150 illustrated in FIG. 3. An embodiment of the data decoding method 700 is illustrated in FIG. 7 and includes the steps outlined below.

In step S710, the encoded data ED encoded by using tail-biting convolutional code technology is received to sequentially identify the first unknown bit section US1, the known bit section KS and the second unknown bit section US2, to further concatenate the second unknown bit section US2 and the first unknown bit section US1 in series to generate the data to be decoded UDD by the data reforming circuit 400.

In step S720, the data to be decoded UDD is decoded by using Viterbi algorithm and the known bit information KI, to generate the decoded result DR that includes the second decoded bit section DS2 and the first decoded bit section DS1 respectively corresponding to the second unknown bit section US2 and the first unknown bit section US1 by the decoding circuit 410.

In step S730, the first decoded bit section DS1, the known decoded bit section KD corresponding to the known bit section KS and the second decoded bit section DS2 are concatenated in series to generate the decoded data DD by the data restoring circuit 420.

Figure 8:
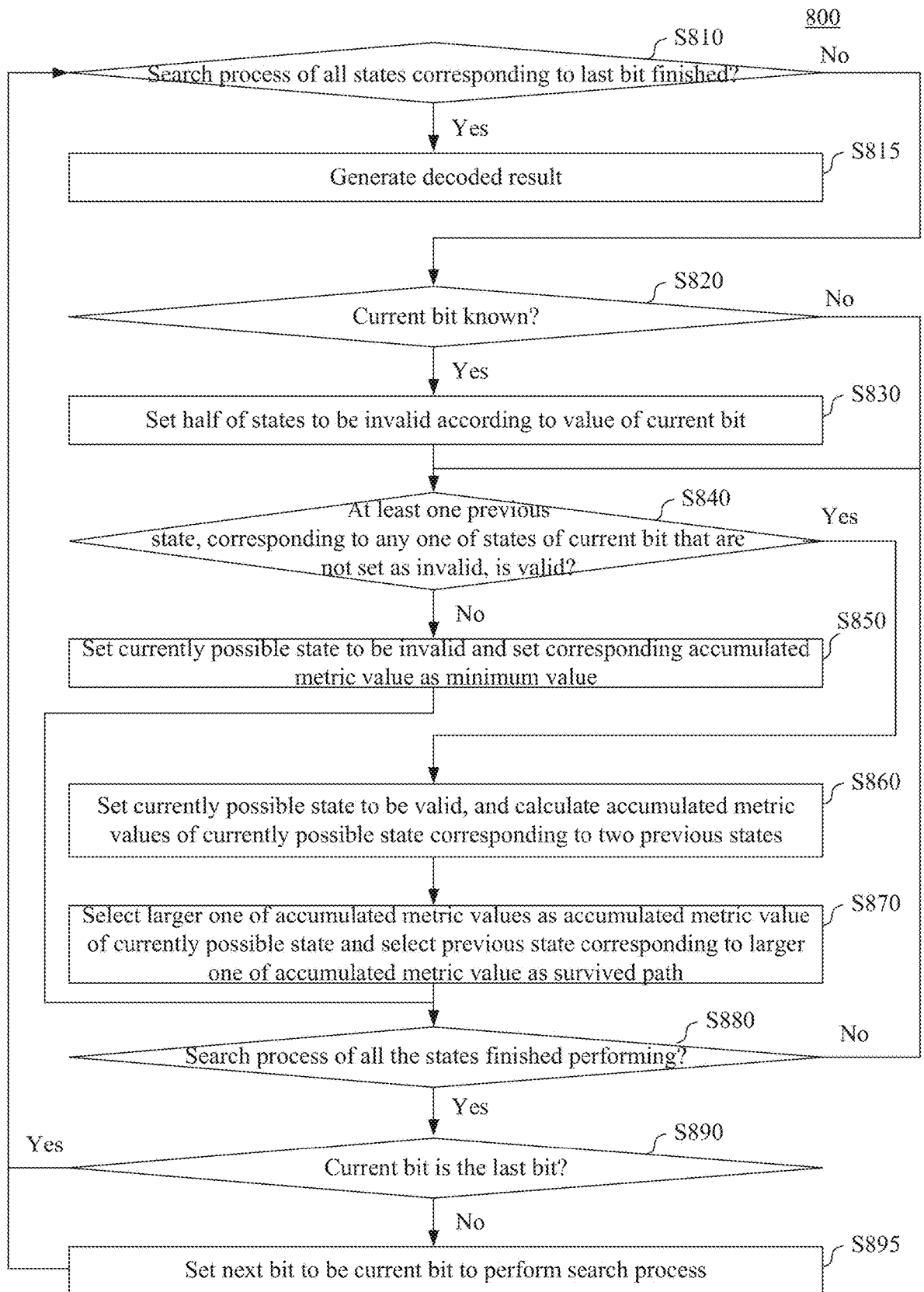
FIG. 8 illustrates a flow chart of a decoding process used to decode the data to be decoded in step in FIG. 7 according to an embodiment of the present invention.

Reference is now made to FIG. 8. FIG. 8 illustrates a flow chart of a decoding process 800 used to decode the data to be decoded UDD in step S720 in FIG. 7 according to an embodiment of the present invention. An embodiment of the data decoding process 800 is illustrated in FIG. 8 and includes the steps outlined below.

In step S810, whether the search process of all the states corresponding to the last bit is finished performing is determined by the decoding circuit 410.

In step S820, when the search process of all the states corresponding to the last bit is not finished, whether the current bit is known is determined according to the known bit information KI by the decoding circuit 410.

In step S830, when the current bit is known, half of the states corresponding to the current bit is set to be invalid according to the value of the current bit by the decoding circuit 410 when the current bit is known.

In step S840, when the current bit is determined to be unknown in step S820 or when step S830 is finished performing, whether at least one of two previous states, corresponding to any one of a currently possible state of the states of the current bit that are not set as invalid, is valid by the decoding circuit 410.

In step S850, when the two previous states are both invalid, the currently possible state is set to be invalid and the corresponding accumulated metric value is set as the minimum value by the decoding circuit 410.

In step S860, when at least one of the two previous states is valid, the currently possible state is set to be valid, and the accumulated metric values of the currently possible state corresponding to the two previous states are calculated by the decoding circuit 410.

In step S870, the larger one of the accumulated metric values corresponding to the two previous states is selected as the accumulated metric value of the currently possible state and the one of the previous states corresponding to the larger one of the accumulated metric values is selected as the survived path by the decoding circuit 410.

In step S880, after steps S850 and S870, whether the search process of all the states is finished performing is determined by the decoding circuit 410. When not all the states is finished performing, the flow goes back to step S840 to keep searching for the unfinished states. When all the states is finished performing, the flow goes to step S890.

In step S890, whether the current bit is the last bit is determined by the decoding circuit 410.

In step S895, when the current bit is not the last bit, the next bit is set to be the current bit to perform search process by the decoding circuit 410.

When the current bit is determined to be the last bit in step S890 or after step S895 is finished performing, the flow goes back to step S810 to perform determining.

When the search process of all the states corresponding to the last bit is determined to be finished, the flow goes to step S810 such that the backtracking is performed according to the survived path to generate the decoded result DR by the decoding circuit 410.

It is appreciated that the embodiments described above are merely an example. In other embodiments, it should be appreciated that many modifications and changes may be made by those of ordinary skill in the art without departing from the spirit of the invention.

In summary, the data decoding circuit and the decoding method of the present invention uses the characteristic of the tail-biting convolutional code to lower the search order and maintain the decoding efficiency at the same time. The power dissipation of the data decoding circuit is greatly reduced such that the data receiving apparatus can save more power.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A data decoding circuit comprising:
   a data reforming circuit configured to receive encoded data encoded by using tail-biting convolutional code technology to sequentially identify a first unknown bit section, a known bit section and a second unknown bit section, to further concatenate the second unknown bit section and the first unknown bit section in series to generate data to be decoded;
   a decoding circuit configured to decode the data to be decoded by using Viterbi algorithm and at least one piece of known bit information, to generate a decoded result that comprises a second decoded bit section and a first decoded bit section respectively corresponding to the second unknown bit section and the first unknown bit section; and
   a data restoring circuit configured to concatenate the first decoded bit section, a known decoded bit section corresponding to the known bit section and the second decoded bit section in series to generated decoded data.

2. The data decoding circuit of claim 1, wherein the encoded data is generated by a data encoding apparatus having a register length based on data under encoded that comprises a first under-encoded bit section, a second under-encoded bit section and a third under-encoded bit section, wherein each of the first under-encoded bit section and the third under-encoded bit section is an unknown bit section, and the second under-encoded bit section is the known bit section and corresponding to the known bit information;
   wherein the data encoding apparatus, based on an encoding rate, generates the first unknown bit section according to the first under-encoded bit section and a first part of the second under-encoded bit section that is neighboring to the first under-encoded bit section and having a length equal to the register length, generates the known bit section according to a second part of the second under-encoded bit section other than the first part and generates the second unknown bit section according to the third under-encoded bit section.

3. The data decoding circuit of claim 2, wherein the first under-encoded bit section comprises a system frame number and a hyper system frame number, and the third under-encoded bit section comprises a cyclic redundancy check (CRC) code.

4. The data decoding circuit of claim 2, wherein the decoding circuit is configured to set an initial search state according to a part of the second under-encoded bit section that is neighboring to the third under-encoded bit section and having a length equal to the register length, to further set each of a plurality of bits of the data to be decoded in series as a current bit to perform a search process, in which the search process comprises:
   determining whether the current bit is known according to the known bit information;
   setting a second half of a plurality of states corresponding to the current bit as invalid and setting a corresponding accumulated metric value as a minimum value when the current bit is known and is 0, and setting a first half of the states corresponding to the current bit as invalid and setting the corresponding accumulated metric value as the minimum value when the current bit is known and is 1;
   determining whether at least one of two previous states, corresponding to any one of a currently possible state of the states of the current bit that are not set as invalid, is valid when the current bit is known or unknown;
   setting the currently possible state as invalid and setting the corresponding accumulated metric value as the minimum value when the two previous states are both invalid;
   setting the currently possible state as valid to respectively calculate the accumulated metric value of the currently possible state corresponding to each of the two previous states, selecting a larger one of the accumulated metric value corresponding to one of the previous states as the accumulated metric value of the currently possible state, and selecting the one of the previous states corresponding to the larger one of the accumulated metric value as a survived path when at least one of the two previous states is valid; and
   setting a next bit that is a next one of the current bit as the current bit to perform the search process when all the states are determined and the corresponding accumulated metric value is generated.

5. The data decoding circuit of claim 4, wherein the decoding circuit is further configured to perform backtracking according to the survived path to generate the decoded result after the search process of all the bits of the data to be decoded is finished.

6. A data decoding method used in a data decoding circuit, comprising:
   receiving encoded data encoded by using tail-biting convolutional code technology to sequentially identify a first unknown bit section, a known bit section and a second unknown bit section, to further concatenate the second unknown bit section and the first unknown bit section in series to generate data to be decoded by a data reforming circuit;
   decoding the data to be decoded by using Viterbi algorithm and at least one piece of known bit information, to generate a decoded result that comprises a second decoded bit section and a first decoded bit section respectively corresponding to the second unknown bit section and the first unknown bit section by a decoding circuit; and
   concatenating the first decoded bit section, a known decoded bit section corresponding to the known bit section and the second decoded bit section in series to generated decoded data by a data restoring circuit.

7. The data decoding method of claim 6, wherein the encoded data is generated by a data encoding apparatus having a register length based on data under encoded that comprises a first under-encoded bit section, a second under-encoded bit section and a third under-encoded bit section, wherein each of the first under-encoded bit section and the third under-encoded bit section is an unknown bit section, and the second under-encoded bit section is the known bit section and corresponding to the known bit information;
   wherein the data encoding apparatus, based on an encoding rate, generates the first unknown bit section according to the first under-encoded bit section and a first part of the second under-encoded bit section that is neighboring to the first under-encoded bit section and having a length equal to the register length, generates the known bit section according to a second part of the second under-encoded bit section other than the first part and generates the second unknown bit section according to the third under-encoded bit section.

8. The data decoding method of claim 7, wherein the first under-encoded bit section comprises a system frame number and a hyper system frame number, and the third under-encoded bit section comprises a cyclic redundancy check (CRC) code.

9. The data decoding method of claim 7, further comprising:
   setting an initial search state according to a part of the second under-encoded bit section that is neighboring to the third under-encoded bit section and having a length equal to the register length, to further set each of a plurality of bits of the data to be decoded in series as a current bit to perform a search process by the decoding circuit, wherein the search process comprises:
   determining whether the current bit is known according to the known bit information;
   setting a second half of a plurality of states corresponding to the current bit as invalid and setting a corresponding accumulated metric value as a minimum value when the current bit is known and is 0, and setting a first half of the states corresponding to the current bit as invalid and setting the corresponding accumulated metric value as the minimum value when the current bit is known and is 1;
   determining whether at least one of two previous states, corresponding to any one of a currently possible state of the states of the current bit that are not set as invalid, is valid when the current bit is known or unknown;
   setting the currently possible state as invalid and setting the corresponding accumulated metric value as the minimum value when the two previous states are both invalid;
   setting the currently possible state as valid to respectively calculate the accumulated metric value of the currently possible state corresponding to each of the two previous states, selecting a larger one of the accumulated metric value corresponding to one of the previous states as the accumulated metric value of the currently possible state, and selecting the one of the previous states corresponding to the larger one of the accumulated metric value as a survived path when at least one of the two previous states is valid; and
   setting a next bit that is a next one of the current bit as the current bit to perform the search process when all the states are determined and the corresponding accumulated metric value is generated.

10. The data decoding method of claim 9, further comprising:
   performing backtracking according to the survived path to generate the decoded result after the search process of all the bits of the data to be decoded is finished by the decoding circuit.

* * * * *